United States Patent
Krakowski et al.

(10) Patent No.: US 7,713,856 B2
(45) Date of Patent: May 11, 2010

(54) POWER SEMICONDUCTOR LASER WITH LOW DIVERGENCE AND LOW ASTIGMATISM, AND METHOD FOR THE PRODUCTION THEREOF

(75) Inventors: Michel Krakowski, Bourg la Reine (FR); Michel Calligaro, Saint Remy les Chevreuse (FR)

(73) Assignee: Thales (FR)

( * ) Notice: Subject to any disclaimer, the term of this patent is extended or adjusted under 35 U.S.C. 154(b) by 177 days.

(21) Appl. No.: 11/722,662

(22) PCT Filed: Dec. 16, 2005

(86) PCT No.: PCT/EP2005/056878

§ 371 (c)(1),
(2), (4) Date: Jun. 22, 2007

(87) PCT Pub. No.: WO2006/067098

PCT Pub. Date: Jun. 29, 2006

(65) Prior Publication Data

US 2008/0225919 A1    Sep. 18, 2008

(30) Foreign Application Priority Data

Dec. 22, 2004    (FR) .................................. 04 13745

(51) Int. Cl.
*H01L 21/44* (2006.01)
(52) U.S. Cl. ...................... 438/597; 438/611; 438/622; 438/652; 438/669; 438/694; 438/700; 438/759; 257/E21.09

(58) Field of Classification Search .................. 438/597, 438/611, 622, 652, 669, 694, 700, 759; 257/E21.09
See application file for complete search history.

(56) References Cited

U.S. PATENT DOCUMENTS

| 4,329,774 | A | 5/1982 | Calligaro |
| 4,803,691 | A | 2/1989 | Scifres et al. |
| 4,901,321 | A | 2/1990 | Blondeau et al. |
| 4,982,269 | A | 1/1991 | Calligaro |
| 5,102,822 | A | 4/1992 | Calligaro |
| 5,115,283 | A | 5/1992 | Blondeau et al. |
| 5,214,661 | A | 5/1993 | Blondeau et al. |

(Continued)

FOREIGN PATENT DOCUMENTS

EP    1312971    5/2003

OTHER PUBLICATIONS

Cheong J-M et al: "High alignment tolerance coupling scheme for multichannel laser diode/singlemode fibre modules using a tapered waveguide array"; Electronics Letters. IEEE Stevenage, GB. vol. 30, No. 18, Sep. 1, 1994, pp. 1515-1516, XP006001045; ISSN: 0013-5194.

(Continued)

*Primary Examiner*—Thanh V Pham
(74) *Attorney, Agent, or Firm*—Lowe Hauptman Ham & Berner, LLP (57) ABSTRACT

The present invention relates to a high-power semiconductor laser having low divergence and low astigmatism, this laser being including, in an active layer, a first part in the form of a narrow monomode stripe with transverse index guiding terminating in a second part flaring out from the first part, also with transverse index guiding.

4 Claims, 5 Drawing Sheets

U.S. PATENT DOCUMENTS

| | | | |
|---|---|---|---|
| 5,896,219 A * | 4/1999 | Wandernoth | 359/279 |
| 6,238,943 B1 | 5/2001 | Kobayashi et al. | |
| 6,249,536 B1 * | 6/2001 | Farries et al. | 372/64 |
| 6,317,445 B1 * | 11/2001 | Coleman et al. | 372/45.01 |
| 2002/0110170 A1 | 8/2002 | Bouadma | |
| 2004/0125846 A1 | 7/2004 | Zediker et al. | |

OTHER PUBLICATIONS

El Yumin S et al: "Monolithic Integratin if GAIN ASP/INP Collimating Grins Lens With Tapered Waveguide Active Region"; Proceedings of the International Conference On Indium Phosphide and Related Materials. HOKKAIDO, May 9-13, 1995, New York, IEEE, US, vol. CONF. 7, May 9, 1995, pp. 721-724, XP000630704; ISBN: 0-7803-2148-0.

U.S. Appl. No. 434 098, filed Nov. 9, 1989, Patrice Arsene-Henry et al. (Abandoned).

* cited by examiner

POWER SEMICONDUCTOR LASER WITH LOW DIVERGENCE AND LOW ASTIGMATISM, AND METHOD FOR THE PRODUCTION THEREOF

CROSS-REFERENCE TO RELATED APPLICATIONS

The present Application is based on International Application No. PCT/EP2005/056878, filed on Dec. 16, 2005, which in turn corresponds to French Application No. 0413745 filed on Dec. 22, 2004, and priority is hereby claimed under 35 USC §119 based on these applications. Each of these applications are hereby incorporated by reference in their entirety into the present application.

FIELD OF THE INVENTION

The present invention relates to a high-power semiconductor laser with low divergence and astigmatism, and also to a method of producing a laser of this type.

BACKGROUND OF THE INVENTION

Semiconductor lasers with a power of greater than 1 watt are generally lasers of the broad stripe type and, depending on the required emission power, may be unitary lasers or lasers arranged in parallel to form arrays. The main drawback of such lasers is that the amplitude distribution of their emitted beam in a plane perpendicular to their emission face is highly divergent (with a divergence of around 15° in a plane parallel to the active layers) and very inhomogeneous. This results in a reduction in the efficiency of coupling to an optical fiber. The cause of this is the existence of parasitic modes in the laser cavity and the presence of "filamentation" defects (the electron current within the semiconductor does not pass through the entire active section of the semiconductor, but inhomogeneously).

To improve the homogeneity of the near field of the emission face of such lasers, a monomode narrow stripe laser (acting as a filter), extended by a flared part acting as an amplifier, is integrated on the same chip. Power levels substantially above 1 watt can then be emitted, while maintaining a monomode transverse beam. The known lasers have been produced in the following two configurations. The first consists in etching, in active layers, a narrow monomode stripe with transverse index guiding followed by a flared part, which also has transverse index guiding, where "transverse index guiding" means that the lateral confinement of the optical field is achieved by differentiation of the refractive index between the narrow stripe zone and the zones bordering the stripe. The second configuration also includes a narrow monomode stripe with transverse index guiding, but followed by a flared part with transverse gain guiding. Hitherto, no other configuration has been proposed, as it was considered that only the two aforementioned configurations allow the quality of the laser beam emitted to be easily controlled. However, these known structures are relatively complex to produce and their dissipated heat is not easy to extract. For example, patent US 2004/125846 discloses a laser of the narrow stripe type, said stripe being extended by a flared part, but this laser is complex to produce (it includes etching and regrowth steps).

SUMMARY OF THE INVENTION

The subject of the present invention is a semiconductor laser emitting a beam whose far field (a few cm from the emission face) has a Gaussian amplitude distribution, has a low divergence and a low astigmatism, and has a power of greater than 1 W, while being temperature-stable, which laser is easy to produce, which may have good thermal dissipation and can be fabricated in groups of several elements on the same substrate.

The method of the invention is a method of producing a semiconductor laser comprising a first part in the form of a narrow monomode stripe terminating in a second part flaring out from the first part, the multilayer structure of this laser being of the type with separate confinements in a plane perpendicular to the plane of the layers and including an active layer with at least one quantum well, characterized in that it comprises the following steps:

epitaxial growth of the substrate and the layers of the multilayer structure;

deposition of an ohmic contact on the upper layer of said structure;

photolithography and etching of two trenches defining between them said first and second parts of the laser;

deposition of an ohmic contact on the underside of the substrate;

deposition of a polymer in the trenches;

photolithography on the upper face of the ohmic contact leaving photoresist to remain on top of a zone lying between the two trenches;

proton implantation through the layer of the contact, the photoresist layer preventing implantation in the zone that it covers; and deposition of an electrode on the upper face of the assembly.

According to another feature of the invention, several unitary lasers are produced side by side on one and the same substrate and in that, after deposition of the electrode on the upper face of the assembly, dicing paths are made in this electrode in order to define unitary lasers or adjacent groups of adjacent unitary lasers and the unitary lasers or groups of unitary lasers are separated along the dicing paths.

According to another feature of the invention, several mini-arrays are formed on a substrate, each comprising several unitary lasers, mini-array bounding trenches are cut into at least some of the layers formed in the substrate and these trenches are filled with a polymer.

According to another feature of the invention, the unitary lasers or the sets of unitary lasers are fastened via their upper face to a heat sink.

The laser according to the invention is a laser comprising, in an active layer, a first part in the form of a narrow monomode stripe with transverse index guiding terminating in a second part flaring out from the first part, also with transverse index guiding, and it is characterized in that the bounding of the two parts of the laser cavity is made by two trenches etched in the surface layers.

BRIEF DESCRIPTION OF THE DRAWING

The present invention will be more clearly understood on reading the detailed description of one embodiment, given by way of nonlimiting example and illustrated by the appended drawing in which.

DETAILED DESCRIPTION OF THE DRAWING

Figure 1:
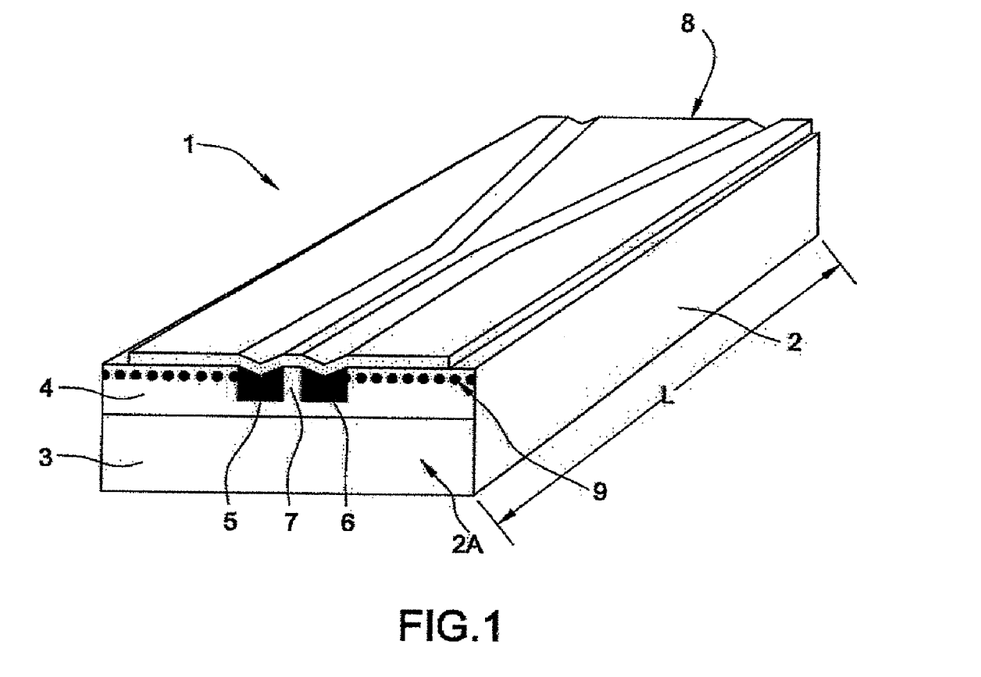
FIG. 1 is a simplified view in perspective of a laser according to the invention.
Figure 4:
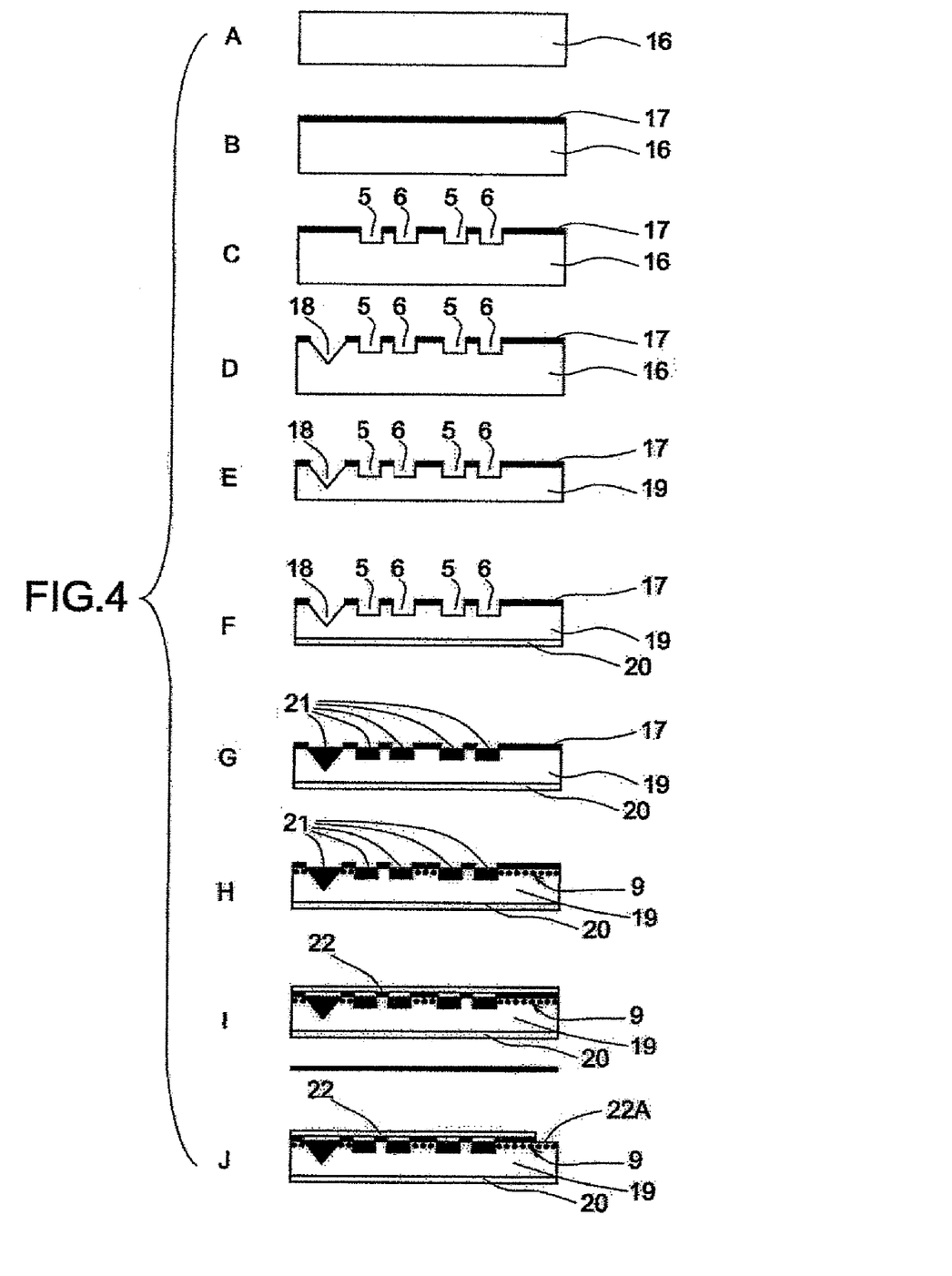
FIG. 4 is a set of ten highly simplified sectional views showing the various steps in the fabrication of an array comprising several unitary lasers of the invention.
Figure 5:
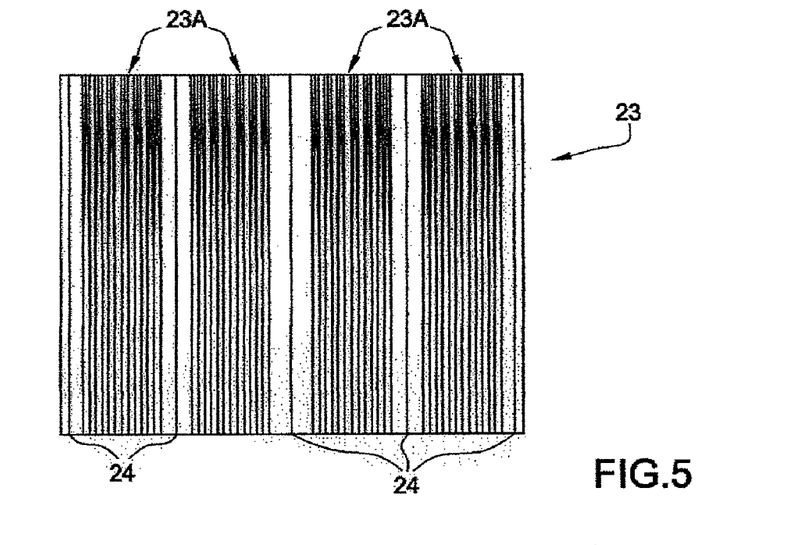
FIG. 5 is a schematic top view of a set of arrays similar to that of FIG. 4.
Figure 6:
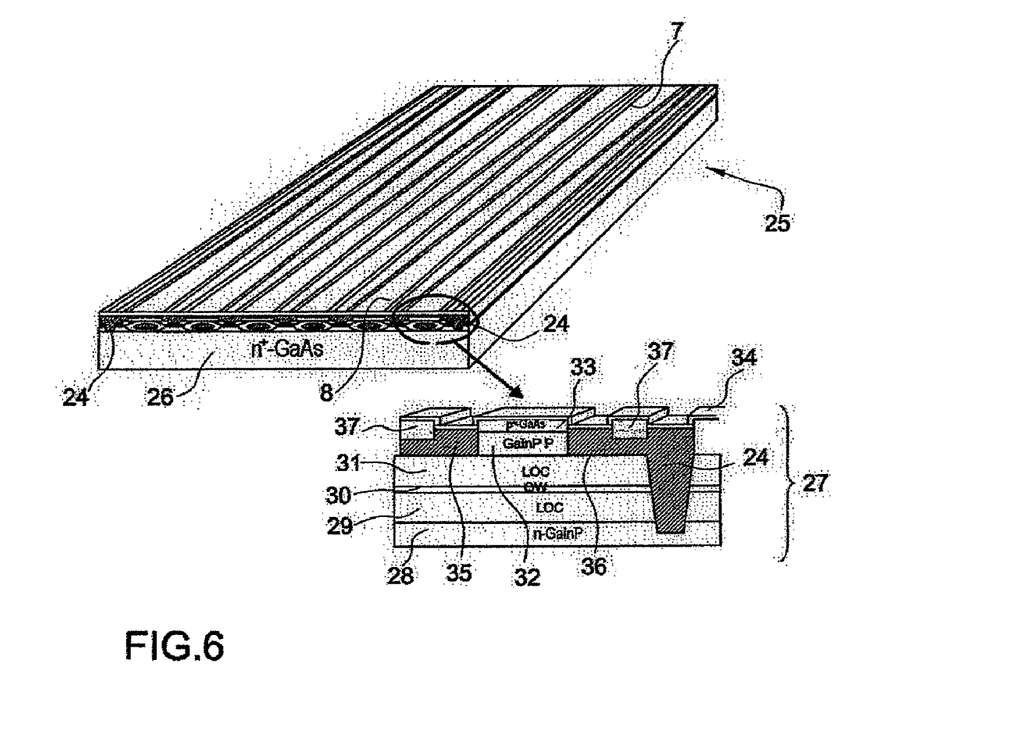
FIG. 6 is a schematic view in perspective of an array similar to that of FIG. 4, together with an enlarged view of a detail.
Figure 7:
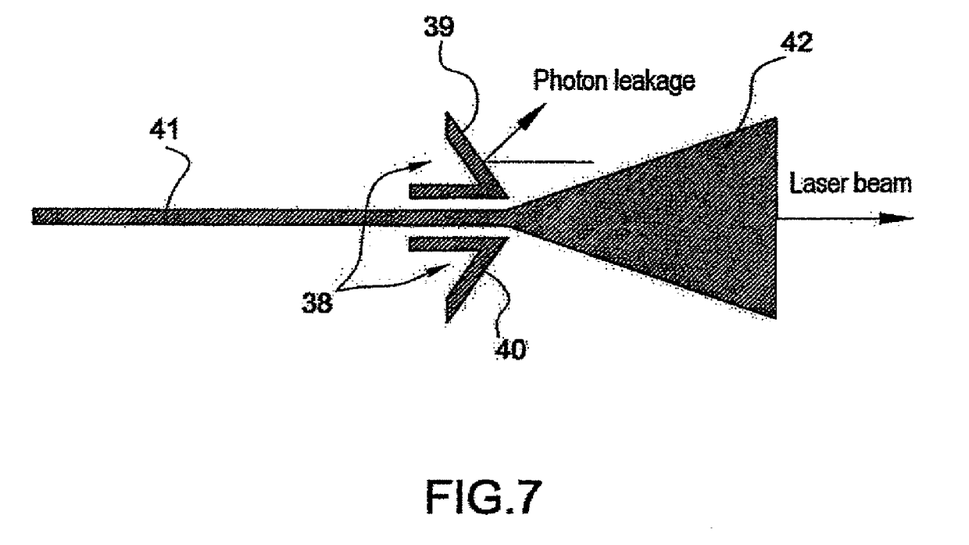
FIG. 7 is a simplified top view of a photon deflector for a laser according to the invention.

The semiconductor laser 1 shown in FIG. 1 is an elementary laser source, but it should be clearly understood that it is possible to form an array comprising several such elementary sources side by side, which are formed in the same semiconductor array, as shown in FIGS. 4 to 6. The laser 1 is in the form of a semiconductor rod 2 of rectangular parallelepipedal shape. This rod 2 essentially comprises a substrate 3 on which a semiconductor multilayer 4 is formed, the details of the multilayer being described below, in particular with reference to FIGS. 2 and 6. Two trenches 5 and 6 are formed, by microlithography and etching, in the layers closest to the surface that lie above the quantum well layer (see FIGS. 2 and 6), which trenches are parallel to each other and to the longitudinal axis of the rod 2 over a first part of their length and which then diverge slightly from each other over the rest of their path, thus defining between them a "current flow channel" or narrow monomode stripe 7 which is extended by a flared part 8. The flare angle of the part 8 is about 1 to 2 degrees, and preferably less than 1°, thereby ensuring that the laser beam emanating from this flared part has a low astigmatism. According to a first exemplary embodiment, the length L of the rod is about 2.5 to 3 mm, the flare angle of the part 8 is about 2° and its length is about 1 mm. According to another exemplary embodiment, the length L is also about 2.5 to 3 mm, the flare angle of the part 8 is about 0.64° and its length is about 2.2 mm. The width of the stripe 7 is a few microns. The external space lying between the outer walls of the trenches 5 and 6 receives an implantation of protons (shown symbolically by dots 9) in the surface layers of the multilayer 4, for example with an energy of about 100 keV, so as to make these layer parts electrically insulating and thus to force, during operation of the laser, the electric current supplied via its electrodes to pass along the channel 7, 8. In this structure, the stripe 7 undergoes transverse monomode guiding and stabilizes the mode of the beam emitted via the flared part 8, which acts as amplifier. If the angle of the flared part 8 is greater than 2°, a deflector such as that described below with reference to FIG. 7 is advantageously formed. The front faces of the rod 2 (perpendicular to the direction of the trenches 5) are obtained by cleaving this rod, after deposition of its electrodes, by cleaving. One of these faces (the face 2A visible in the drawing) receives a high-reflectivity treatment, whereas the opposite face (the face from which the laser beam exits) receives an antireflection treatment.

Figure 2:
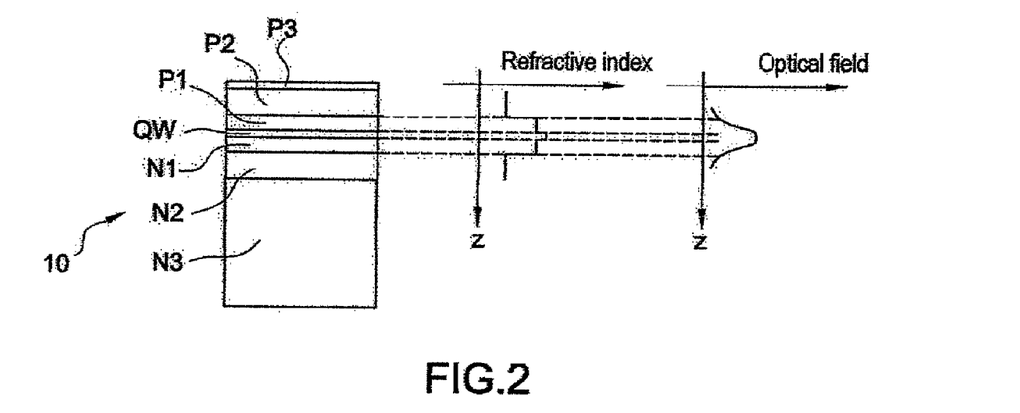
FIG. 2 is a schematic sectional view showing the various confinement and active layers of the laser of FIG. 1.

The semiconductor structure of the laser of the invention is shown schematically in FIG. 2. This structure is of the type with separate confinements in a plane perpendicular to the planes of the layers, with an active layer having at least one quantum well. It is formed on a highly n-doped substrate N3, for example made of GaAs. The following layers are formed in succession on this substrate:

a low-index n-type layer N2 for optical and electrical confinement, which layer may be made of GaInP, GaAlAs, AlGaInP, etc.;

a high-index n-type layer N1 for electrical and optical confinement, which layer may be made of GaInAsP, GaInP, etc.;

a layer QW, which is an active quantum well layer;

a high-index p-type layer P1 for electrical and optical confinement, which layer may be made of GaInAsP, GaInP, etc.;

a low-index p-type layer P2 for optical confinement; which layer may be made of GaInP, GaAlAs, AlGaInP, etc.; and a highly p-doped electrical contact layer P3, for example made of GaAs.

Corresponding to the diagram of the structure that has just been described, FIG. 2 shows, to the right of this structure, the curve of variation of the refractive index of the various layers that make up said structure, and also the curve of variation of the intensity of the optical field along a direction perpendicular to the planes of these layers.

Thus, thanks to the formation of the trenches 5 and 6, a stripe laser is produced with guiding in planes parallel to the planes of the layers, through the real part of the refractive index of the semiconductor material traversed. These trenches may be etched in various ways, depending on the nature of the material of the layer P2. If this layer is made of GaInP, the etching is carried out using a wet chemical process, with self-alignment with respect to the pattern of the metal of the ohmic contact (deposited on the upper layer of the multilayer 4), owing to the high etching rate selectivity of the quaternary alloy of the layer P1, the etching generally being stopped at the boundary between the layers P2 and P1 (if the difference between the index of the layer P1 and that of the layer P2 is large enough). If the layer P1 is made of GaAlAs, the etching is carried out by a dry plasma etching process (of the RIE, ICP type, etc.) self-aligned with respect to the pattern of the metal of the ohmic contact (deposited on the upper layer of the multilayer 4). The trenches thus produced are filled with a polymer and made coplanar with the aforementioned ohmic contact layer. The polymer material electrically isolates the zones 7 and 8 from the semiconductor material of the same layers, to the outside of the trenches 5 and 6.

The laser structure of the invention that has just been described may be fastened via its upper face (the face closest to the layer P3) to a heat sink, thereby optimizing its thermal dissipation.

Figure 3:
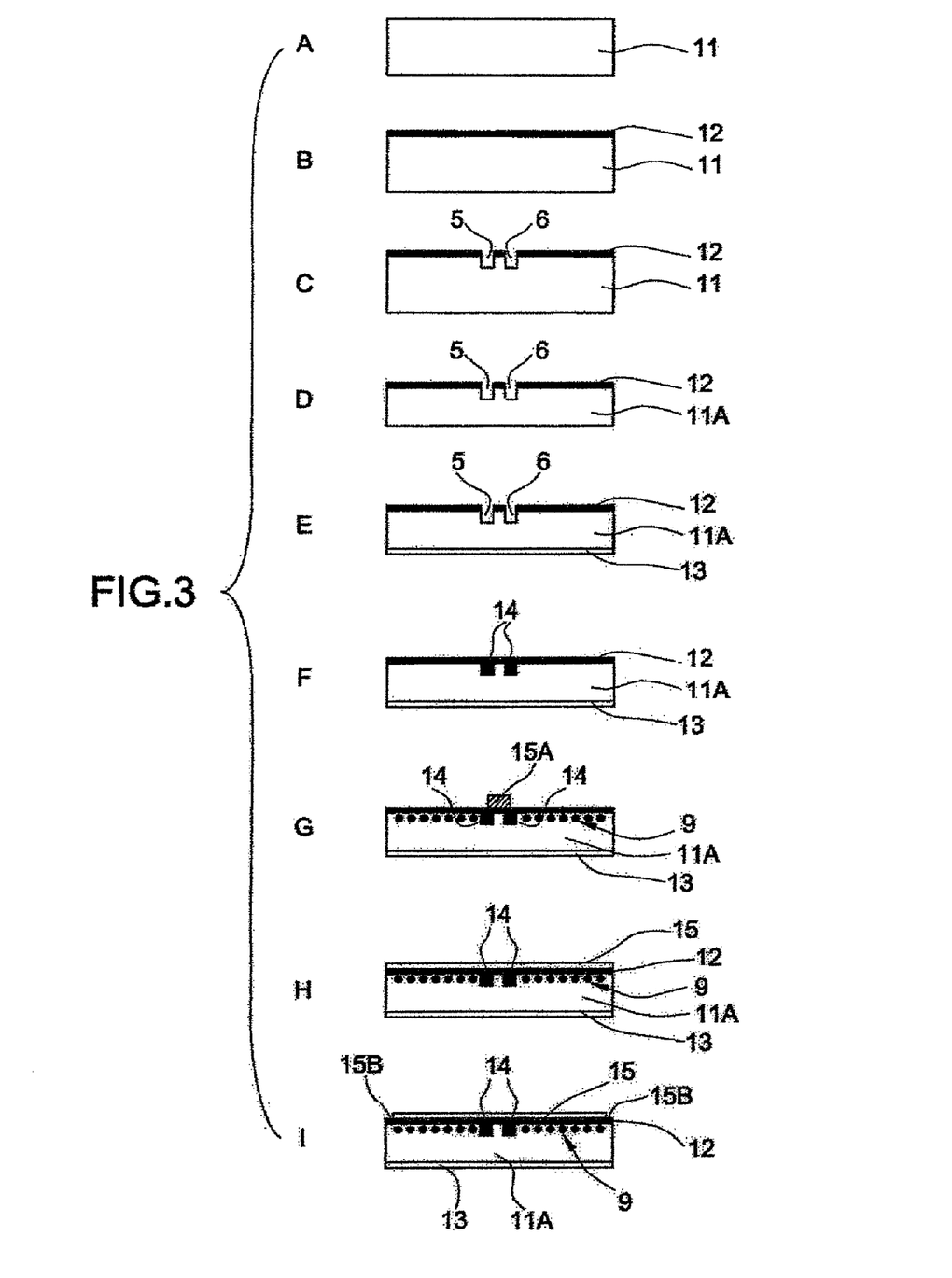
FIG. 3 is a set of nine highly simplified sectional views showing the various steps in the fabrication of the unitary laser of the invention.

FIG. 3 shows schematically the first nine steps, referenced A to I, from the twelve main steps for producing the structure of the laser of the invention. These steps are, in order:

(A): epitaxial growth of the substrate and of the following layers, as shown in FIG. 2, the combination being referenced 11;

(B): deposition of an ohmic contact 12 on the layer P3 of the structure 11;

(C): photolithography and etching of the two trenches 5 and 6;

(D): thinning of the substrate (on the opposite side from the layer 15), the overall semiconductor structure now being referenced 11A;

(E): deposition of an ohmic contact 13 on the underside of the substrate, and annealing of this contact;

(F): deposition of a polymer 14 in the trenches 5 and 6 followed by removal of the surplus, so as to obtain a plane surface coplanar with the upper face of the layer 12;

(G): photolithography on the upper face of the layer 12, then proton implantation (9), so as to properly isolate the parts 7 and 8, and then, since the zone lying beneath the photoresist part 15A remaining after the photolithography (between the two trenches 5 and 6) does not include protons, removal of the part 15A;

(H): deposition of an electrode 15 on the layers 12 and 14;

(I): photolithography and opening of the dicing paths 15B between adjacent unitary lasers or adjacent groups of elementary lasers;

cleavage of the emission and high-reflectivity faces;

antireflection treatment of the laser emission faces;

high-reflectivity treatment of the faces on the opposite side from the emission faces; and separation of the elementary lasers (or of the arrays of elementary lasers) along the dicing paths 15B.

FIGS. 4 to 6 relate to steps in the fabrication of one or more mini-arrays, each comprising several elementary lasers as shown in FIG. 1 and all produced on the same substrate. The optical separations between adjacent mini-arrays are achieved by forming trenches with sidewalls that are not perpendicular to the planes of the active layers in the active layers (see FIG. 6). These fabrication steps are the following, in order:

(A): epitaxial growth of the substrate and the following layers, as shown in FIG. 2, the combination being referenced 16;

(B): deposition of a p$^+$-type ohmic contact 17 on the layer P3 of the structure 16;

(C): photolithography and etching, for each elementary laser, of the two trenches 5 and 6;

(D): photolithography and etching of the separations 18 between adjacent mini-arrays;

(E): thinning of the substrate (on the opposite side from the layer 17), the overall semiconductor structure now being referenced 19;

(F): deposition of an ohmic contact 20 on the underside of the substrate, and annealing of this contact;

(G): deposition of a polymer 21 in the trenches 5, 6 and 18 and then removal of the surplus so as to obtain a plane surface, coplanar with the upper face of the layer 17;

(H): photolithography on the upper face of the layer 17 and then proton implantation (9) so as to properly isolate the layers 7 and 8 from the surrounding zones;

(I): deposition of an electrode 22 on the layers 17 and 21;

(J): photolithography and opening of the dicing paths between adjacent unitary lasers or adjacent groups of elementary lasers;

cleavage of the emission and high-reflectivity faces;

antireflection treatment of the laser emission faces;

high-reflectivity treatment of the faces on the opposite side from the emission faces; and separation of the mini-arrays of elementary lasers.

FIG. 5 shows a partial top view of a set 23 of four mini-arrays 23A formed on the same substrate with their optical separation trenches 24.

The perspective view of FIG. 6 shows one of the mini-arrays of FIG. 5, referenced 25 and formed on a substrate 26 for example made of n$^+$-type GaAs. A semiconductor active multilayer 27 is formed on this substrate. This multilayer comprises, in order on the substrate 26: a layer 28, for example made of n-type GaInP; a layer 29 forming a first large optical cavity, corresponding to the combination of layers N2 and N1 of FIG. 2; an optical well 30; a second large optical cavity 31 corresponding to the layer P1 of FIG. 2; a p-type layer 32, for example made of p-type GaInP; a layer 33, for example made of p$^+$-type GaAs; and an electrode-forming layer 34, for example made of PtCrAuPtAu deposited over the entire upper surface of the mini-array after the etching of the trenches described below. As may be noticed in FIG. 6, the layer 34 is not plane as it follows the profile of the subjacent layers. The trenches 35, 36 for bounding the laser stripe and its flared part are cut into the layers 32 and 33, whereas the trenches 24 for bounding the mini-arrays are cut into all the layers 29 to 33 and partially into the thickness of the layer 28. The sidewalls of the trenches 24 are perpendicular to the planes of the semiconductor layers in the layers 32 and 33 and are oblique in the other layers 28 to 31, making an angle of a few degrees between them for example between about 0.5 and 2°. All the trenches 24, 35 and 36 are filled with a polymer. Protons are implanted in the zones 37 of the layers 32 and 33 bordering the trenches 35, 36 to the outside. The implantation does not necessarily stop at the layer 32.

The diagram in FIG. 7 shows in particular the details in producing a deflector 38. This deflector comprises two elements 39, 40 which have, seen from above, a "V"-shape and are placed symmetrically on either side of the laser stripe 41, close to its junction with the flared part 42. One of the branches of each "V" is parallel to the stripe 41, whereas the other branch makes an angle of less than 90° to the first, the apex of each "V" being directed toward the flared part 42. The two "Vs" of this deflector are produced by cutting into the active layers lying above the quantum well of the "trenches" with walls perpendicular to the planes of these layers and the cross section of which, in a plane parallel to the plane of the layers, is in the form of a "V" described above. These trenches are then filled with a polymer material, making them electrically insulating.

Thus, thanks to the invention, it is possible to produce elementary laser sources or laser sources grouped in arrays, and to fasten them via their upper face (face 18) to an appropriate heat sink. This considerably improves the extraction of heat in operation compared with the sources of the prior art, which can be fixed to a sink only via their base.

According to the exemplary embodiments of the invention, what are obtained are elementary lasers having wavelengths lying between 0.7 and 1.1 μm with quantum wells or boxes (called "Qdots") on a GaAs substrate, having wavelengths lying between 1.1 and 1.8 μm with Qdots on an InP substrate, wavelengths lying between 2 and 2.5 μm in the case of quantum wells or Qdots on a GaSb substrate, and wavelengths lying between 3 and more than 12 μm with QCL-type laser sources.

In these exemplary embodiments, the constant width of the trenches bounding the stripe and its flared part is about 6 to 7 μm, the width of the stripes is 3 to 4 μm, the length of the stripes is 500 μm at most, the length of the flared parts is 2500 to 3000 μm at most, their flare angle is about 0.64° and the pitch of the elementary lasers of any one mini-array is about 50 μm.

In general, for all these exemplary embodiments, the divergence of the emitted beam is around 2° at mid-height of its amplitude curve, and the power of the beam at the exit of the flared part is equal to about 1 W or higher.

According to a variant of the invention (not shown) it is possible for the axis of the flared part 8 not to be aligned with respect to the axis of the stripe 7 but to make an angle of a few degrees to said axis (in a plane parallel to that of the active layers) so as to reduce the reflectivity in the laser beam exit face.

The invention claimed is:

1. A method of producing a semiconductor laser comprising a first part in the form of a narrow monomode stripe terminating in a second part flaring out from the first part, the multilayer structure of this laser being of the type with separate confinements in a plane perpendicular to the plane of the layers and including an active layer with at least one quantum well, comprising the following steps:

epitaxial growth of the substrate and the layers of the multilayer structure;

deposition of a first ohmic contact on the upper layer of said structure;

photolithography and etching of two trenches defining between them said first and second parts of the laser;

deposition of a second ohmic contact on the underside of the substrate;

deposition of a polymer in the trenches;

photolithography on the upper face of the first ohmic contact leaving photoresist to remain on top of a zone lying between the two trenches;

proton implantation through the layer of the contact, the photoresist layer preventing implantation in the zone that it covers; and deposition of an electrode on the upper face of the assembly.

2. The method as claimed in claim 1, wherein several unitary lasers are produced side by side on one and the same substrate and in that, after deposition of the electrode on the upper face of the assembly, dicing paths are made in this electrode in order to define unitary lasers or adjacent groups of adjacent unitary lasers and the unitary lasers or groups of unitary lasers are separated along the dicing paths.

3. The method as claimed in claim 1, wherein several mini-arrays are formed on a substrate, each comprising several unitary lasers, in that mini-array bounding trenches are cut into at least some of the layers formed in the substrate and in that these trenches are filled with a polymer.

4. The method as claimed in claim 1, wherein the unitary lasers or the sets of unitary lasers are fastened via their upper face to a heat sink.

* * * * *